United States Patent
Prather et al.

(10) Patent No.: US 7,985,921 B2
(45) Date of Patent: *Jul. 26, 2011

(54) SYSTEMS TO RETAIN AN OPTICAL ELEMENT ON A SOLAR CELL

(75) Inventors: Eric Prather, Santa Clara, CA (US); Hing Wah Chan, San Jose, CA (US)

(73) Assignee: Solfocus, Inc., Mountain View, CA (US)

( * ) Notice: Subject to any disclaimer, the term of this patent is extended or adjusted under 35 U.S.C. 154(b) by 359 days.

This patent is subject to a terminal disclaimer.

(21) Appl. No.: 12/038,392

(22) Filed: Feb. 27, 2008

(65) Prior Publication Data

US 2009/0120499 A1 May 14, 2009

Related U.S. Application Data

(60) Provisional application No. 60/987,882, filed on Nov. 14, 2007.

(51) Int. Cl.
*H01L 31/0232* (2006.01)
*H01L 31/052* (2006.01)

(52) U.S. Cl. .......... 136/259; 136/252; 136/246; 438/57; 438/65

(58) Field of Classification Search .......... 136/246, 136/256
See application file for complete search history.

(56) References Cited

U.S. PATENT DOCUMENTS

| | | | |
|---|---|---|---|
| 2005/0046977 A1 | 3/2005 | Shifman | |
| 2005/0206834 A1* | 9/2005 | D'Agostino | 351/41 |
| 2005/0268958 A1 | 12/2005 | Aoyama | |
| 2006/0169315 A1 | 8/2006 | Levin | |
| 2006/0185713 A1* | 8/2006 | Mook, Jr. | 136/244 |
| 2009/0107541 A1* | 4/2009 | Linke et al. | 136/246 |
| 2009/0120500 A1* | 5/2009 | Prather et al. | 136/259 |

FOREIGN PATENT DOCUMENTS

| | | |
|---|---|---|
| JP | 03-209881 A | 9/1991 |
| JP | 05-067770 A | 3/1993 |
| JP | 05-102518 A | 4/1993 |
| JP | 05-110128 A | 4/1993 |
| JP | 10-232910 A | 9/1998 |
| JP | 2005-269627 A | 9/2005 |
| JP | 2006-093335 A | 4/2006 |

OTHER PUBLICATIONS

"PCT International Search Report", dated Aug. 18, 2009 for PCT/US2008/087998, 3pgs.
"PCT International Search Report", dated Aug. 18, 2009 for PCT/US2008/087987, 3pgs.

* cited by examiner

*Primary Examiner* — Jennifer K. Michener
*Assistant Examiner* — Jayne Mershon
(74) *Attorney, Agent, or Firm* — Buckley, Maschoff & Talwalkar LLC (57) ABSTRACT

A system may include a solar cell, a support defining an opening over the solar cell and comprising a retention feature, and an optical element disposed within the opening. The optical element may include a location feature engaged with the retention feature of the support. In some aspects, the optical element includes an upper surface to receive concentrated light and a lower surface through which light passes to the solar cell, and the location feature is disposed between the upper surface and the lower surface. The retention feature may be a lip defining the opening over the solar cell, and/or the location feature may consist of a notch defined by an edge of the optical element.

6 Claims, 10 Drawing Sheets

FIG. 10B down# SYSTEMS TO RETAIN AN OPTICAL ELEMENT ON A SOLAR CELL

CROSS-REFERENCE TO RELATED APPLICATIONS

The present application claims priority to U.S. Provisional Patent Application Ser. No. 60/987,882, filed on Nov. 14, 2007 and entitled "Devices For Retaining An Optical Element On A Solar Cell", the contents of which are incorporated herein by reference for all purposes.

BACKGROUND

A concentrating solar power unit may operate to concentrate incoming light onto a solar cell. It may be desirable to couple an optical element to the solar cell in order to increase an acceptance angle of the concentrating solar power unit, to homogenize the light source over the surface of the cell, and/or to further focus the light. An upper (i.e., incoming) surface of the optical element should be retained in a particular spatial position relative to other optical elements in the system, and a lower (i.e., outgoing) surface of the optical element should be retained in a particular spatial position relative to an active area of the solar cell. The size and weight of the optical element typically prohibit bonding the optical element directly to the fragile surface of the active area as a means of achieving this positioning.

Some conventional concentrating solar power units use a three part mounting scheme to retain an optical element on a solar cell. The solar cell is mounted to a back side of a substrate, and a lower holder is mounted to a front side of the substrate. Both the lower holder and the substrate define openings to allow incoming light to pass to the solar cell. The openings are filled with a PDMS (silicone) gel and an optical element is placed in the openings such that the lower holder positions the bottom of the optical element over cell. The gel is cured between the bottom of the optical element and the solar cell to a thickness greater than the final operating thickness.

An upper holder is then placed to position the top of the optical element over the cell and to exert some compressive force against the cell. Placement of the upper holder therefore also serves to compress the gel. This compression may push out bubbles that may have formed during the cure and fixes a gap between the optical element and the cell.

The upper holder may include tabs to locate the top surface of the optical element. These tabs may plastically deform over time and reduce the compression of the gel. Moreover, although many packaging houses are familiar with silicone dispense, the size and geometry of the above-described assembly may create difficulties in high volume packaging lines.

Overcompression may cause the optical element to damage the cell. The gel itself may flow out of the gap over time (e.g., due to thermal pumping, etc), thereby degrading the optical coupling. The lower holder may be subject to oxidation if it receives highly concentrated light during operation. Products of the oxidation may be absorbed into the optical coupling or may be deposited on the optical element, degrading the optical performance and possibly leading to failure of the power unit.

Improved systems to retain an optical element on a solar cell are desired. Such systems may improve manufacturability, the retention of the optical element, the maintenance of the optical coupling and/or the quality of an optical coupling.

BRIEF DESCRIPTION OF THE DRAWINGS

The construction and usage of embodiments will become readily apparent from consideration of the following specification as illustrated in the accompanying drawings, in which like reference numerals designate like parts.

DETAILED DESCRIPTION

The following description is provided to enable any person in the art to make and use the described embodiments and sets forth the best mode contemplated by for carrying out some embodiments. Various modifications, however, will remain readily apparent to those in the art.

Figure 1:
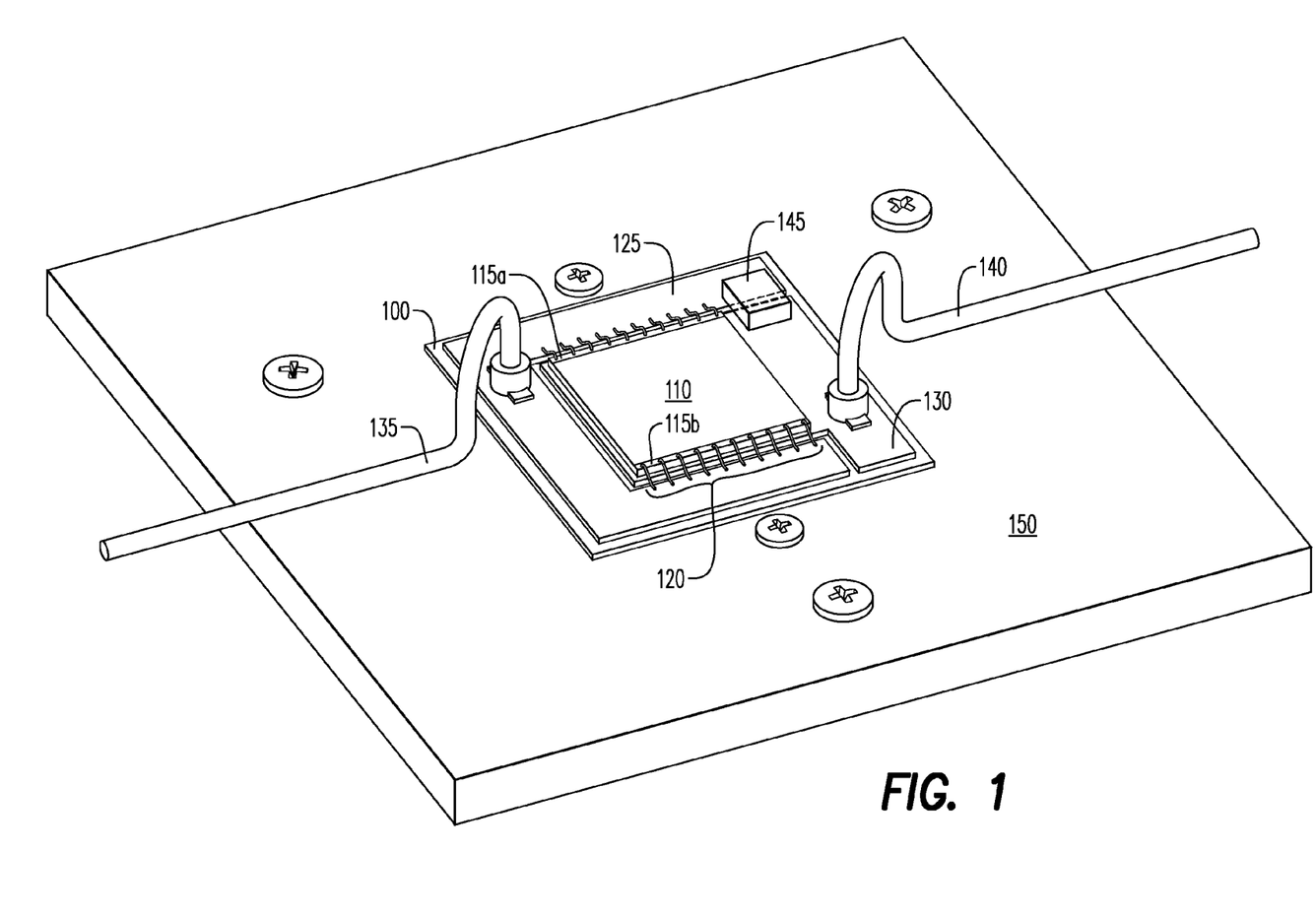
FIG. 1 is a perspective view of a substrate, heatsink, and a solar cell according to some embodiments.

FIG. 1 is a perspective view of integrated circuit package substrate 100 and solar cell 110 according to some embodiments. Substrate 100 may comprise a single molded piece of material (e.g., a molded leadframe) or may comprise a suitable substrate with conductive elements deposited thereon using photolithography, lamination, or any other suitable technique.

Substrate 100 may comprise a metalized ceramic substrate according to some embodiments. A ceramic substrate may be less susceptible to deterioration due to stray concentrated light than conventional solar cell packaging materials. In some specific embodiments, substrate 100 comprises metalized alumina. Embodiments of substrate 100 may comprise any combination of one or more suitable materials, the selection of which may take into account heat dissipation, thermal expansion, strength and/or other qualities.

Solar cell 110 may comprise a III-V solar cell, a II-VI solar cell, a silicon solar cell, or any other type of solar cell that is or becomes known. Solar cell 110 may comprise any number of active, dielectric and metallization layers, and may be fabricated using any suitable methods that are or become known.

Solar cell 110 may receive photons at an active area located on the illustrated top side of solar cell 110, and may generate charge carriers (i.e., holes and electrons) in response to the photons. In this regard, solar cell 110 may comprise three distinct junctions deposited using any suitable method, including but not limited to molecular beam epitaxy and/or molecular organic chemical vapor deposition. The junctions may include a Ge junction, a GaAs junction, and a GaInP junction. Each junction exhibits a different band gap energy, which causes each junction to absorb photons of a particular range of energies.

According to the depicted embodiment, conductive contacts 115a and 115b are disposed on an upper side of solar cell 110. Each of conductive contacts 115a and 115b may comprise any suitable metal contact, and may include a thin adhesion layer (e.g., Ni or Cr), an ohmic metal (e.g., Ag), a diffusion barrier layer (e.g., TiW or TiW:N), a solderable metal (e.g., Ni), and a passivation metal (e.g., Au). Wirebonds 120a and 120b electrically couple conductive contacts 115a and 115b to conductive element 125. Conductive contacts 115a and 115b therefore exhibit a same polarity according to some embodiments.

A further conductive contact (not shown) may be disposed on a lower side of solar cell 110. This conductive contact may exhibit a polarity opposite from the polarity of conductive contacts 115a and 115b. This conductive contact is electrically coupled to conductive element 130 using silver die attach epoxy or solder according to some embodiments. Embodiments are not limited to the illustrated number, location and polarities of conductive contacts.

Conductive elements 125 and 130 may comprise any suitable conductive materials and may be formed using any suitable techniques. Embodiments are not limited to the illustrated shapes and relative sizes of conductive elements 125 and 130. Substrate 100 is considered herein to comprise conductive elements 125 and 130. Accordingly, FIG. 1 depicts the coupling of solar cell 110 to substrate 100.

By virtue of the foregoing arrangement, current may flow between wires 135 and 140 while solar cell 110 actively generates charge carriers. If solar cell 110 is faulty or otherwise fails to generate charge carriers, bypass diode 145 may electrically couple conductive element 125 to conductive element 130 in response to a received external signal. Bypass diode 145 therefore allows current to flow between wires 135 and 140 and through any external circuit to which wires 135 and 140 are connected.

Heatsink 150 may be coupled to a "back" side of substrate 100 using silver die attach epoxy, thermal grease, curable thermal grease, a silicone adhesive and/or any other suitable compound. Heatsink 150 may comprise copper and may facilitate dissipation of heat from substrate 100. Heatsink 150 may also include structures to facilitate mounting the illustrated apparatus to a support. According to some embodiments, substrate 100 itself comprises a heatsink, and heatsink 150 is not employed.

Figure 2:
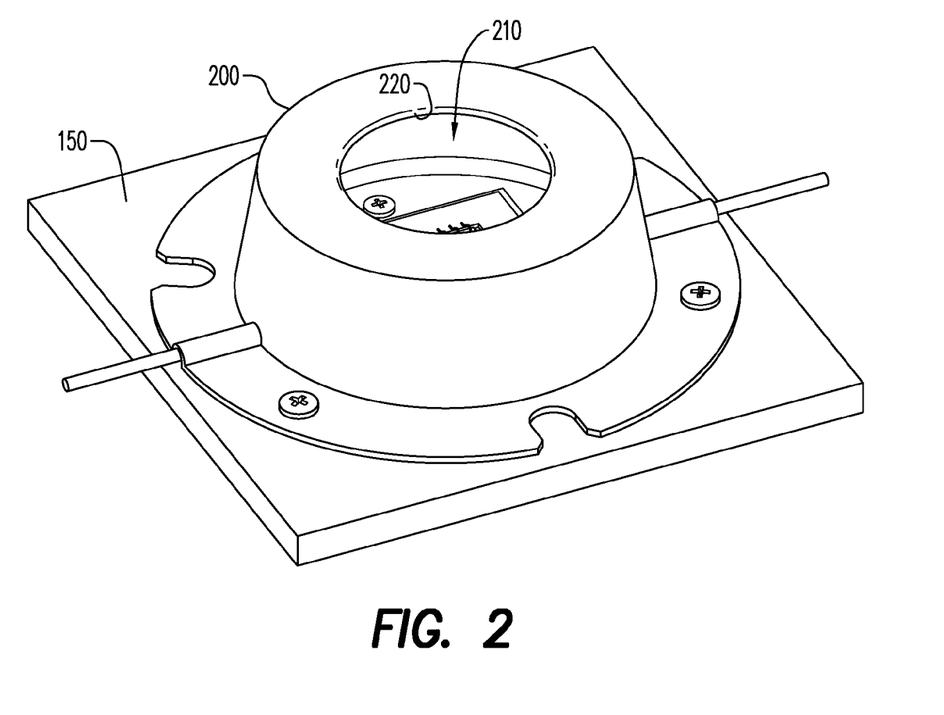
FIG. 2 is a perspective view of a substrate and a support according to some embodiments.

FIG. 2 is a perspective view of support 200 mounted to heatsink 150 of the FIG. 1 embodiment. Embodiments are not limited to the FIG. 1 implementation, and support 200 according to some embodiments may be mounted to a component other than component to which substrate 100 is mounted. In some embodiments, support 200 is mounted on substrate 100.

Support 200 defines opening 210 positioned over at least a portion of an active area of solar cell 110. Opening 210 may exhibit any shape, regular or irregular, and may be defined by lip 220 of support 200. In some embodiments, lip 220 may be rounded to facilitate its retention function described below. Accordingly, lip 220 may be considered a retaining element of support 200. More particularly, each portion of lip 220 that engages a location feature of an optical element may be considered a separate retaining feature. Retaining features of support 200 are not limited to those discussed herein.

Support 200 may comprise any suitable material(s), including but not limited to aluminum, magnesium and zinc alloys. Support 200 may be required to withstand significant heat and to expand in response to such heat in unison with the elements to which it is coupled. Support 200 may also exhibit a degree of deformability sufficient to allow opening 210 to expand in response to moving a tapered optical element therethrough, while also providing a suitable compressive force against the optical element during operation. The foregoing considerations will be discussed in more detail below.

Figure 3A:
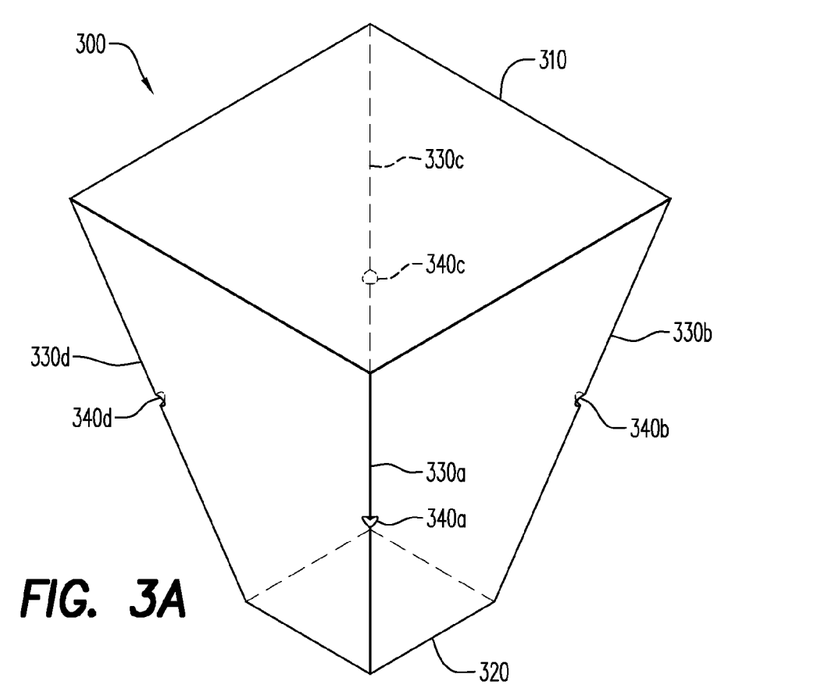
FIGS. 3A and 3B comprise various views of an optical element according to some embodiments.
Figure 3B:
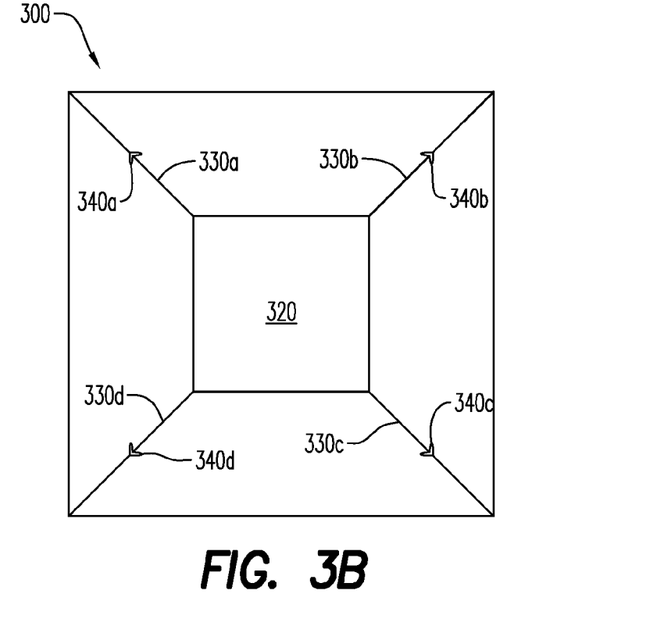

FIGS. 3A and 3B illustrate optical element 300 according to some embodiments. Optical element 300 may be configured to receive and manipulate desired wavelengths of light and/or pass the light to solar cell 110. For example, solar cell 110 may receive photons from optical element 300 and generate electrical charge carriers in response thereto. Optical element 300 may be deliberately designed to eliminate photons which would not result in electrical charge carriers, thereby reducing an operational temperature and improving the performance of solar cell 110. As described above, optical element 300 may increase an acceptance angle of the concentrating solar power unit in which it resides, homogenize the light over the surface of the cell, and/or further focus the light. Optical element 300 may comprise any suitable composition and shape (e.g., a low-iron glass rod, an lucite prism, etc.).

Optical element 300 according to FIGS. 3A and 3B includes upper surface 310 for receiving concentrated light from a solar concentrator. The concentrated light passes through lower surface 320 to an active area of solar cell 110. Illustrated optical element 300 includes edges 330a through 330d, each of which extends from upper surface 310 to lower surface 320. Moreover, each of edges 330a through 330d defines a corresponding one of location features 340a through 340d.

Location features 340a through 340d comprise rounded notches in the illustrated embodiment, but embodiments are not limited thereto. Location features 340a through 340d are disposed between, but not necessarily equidistant from, upper surface 310 and lower surface 320. Location features 340a through 340d may be disposed at locations determined to result in minimal impact to the light-delivering function of optical element 300.

Figure 4:
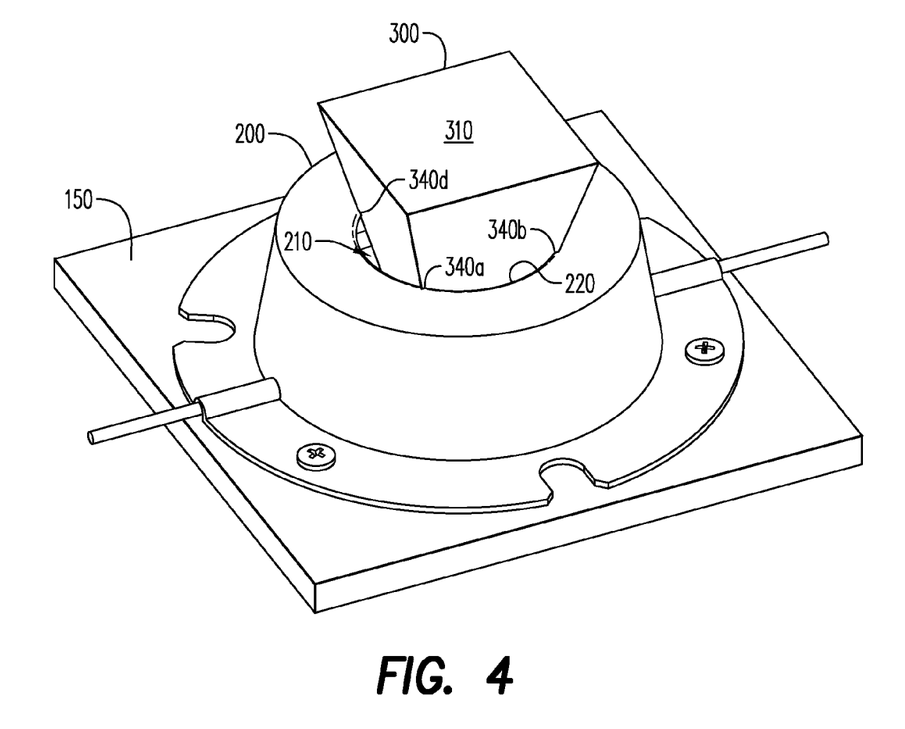
FIG. 4 is a perspective view of a substrate, a support, an optical element and a heatsink according to some embodiments.
Figure 5:
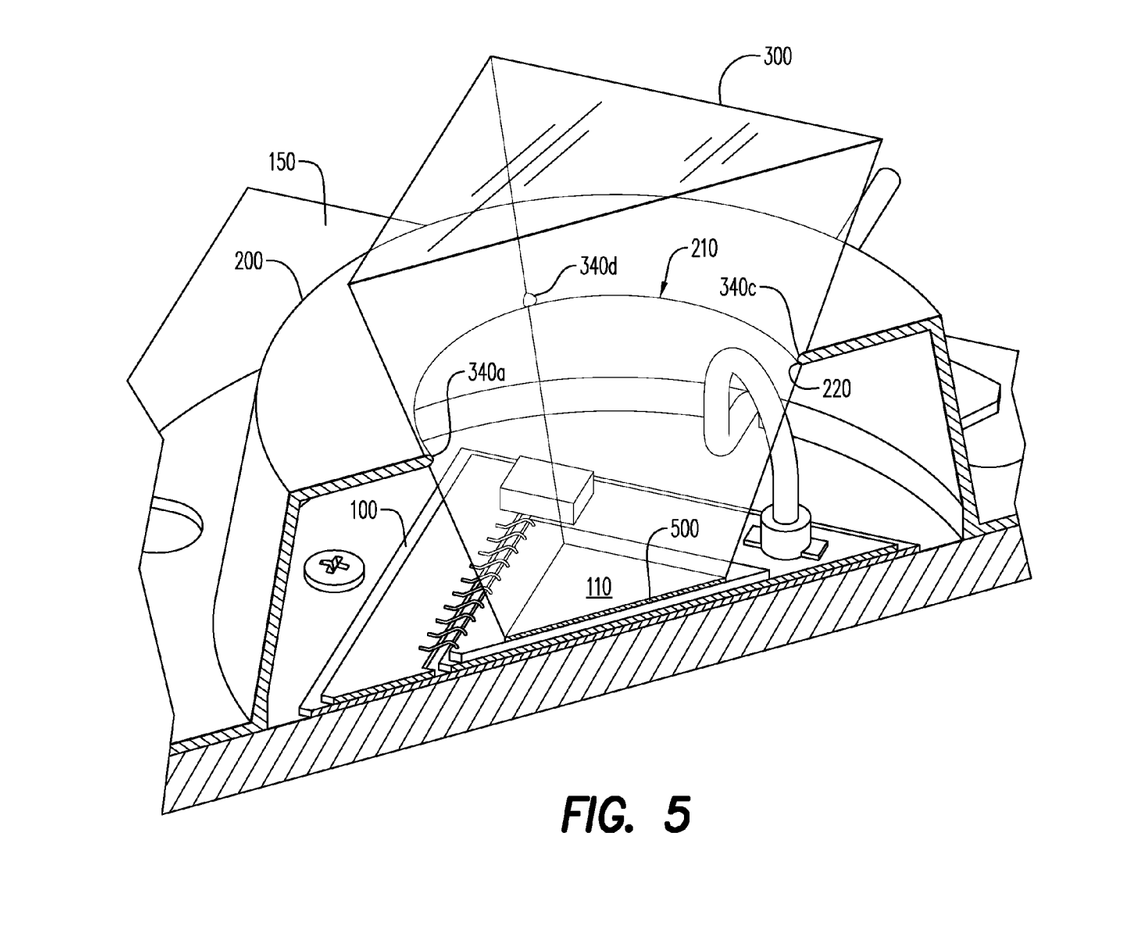
FIG. 5 is a partially transparent view of a substrate, a support, an optical element and a heatsink according to some embodiments.

FIG. 4 is a perspective view of support 200 mounted on heat sink 150 and optical element 300 disposed within opening 210. FIG. 4 shows location features 340a through 340c engaged with lip 220 of support 200. FIG. 5 is a view similar to FIG. 4 in which elements obscured by support 200 are represented by dashed lines.

FIG. 5 shows substrate 100 coupled to heatsink 150, and solar cell 110 coupled to substrate 100. Optical coupling material 500 is disposed on solar cell 110 and is compressed thereon by lower surface 320 of element 300. Optical coupling material 500 may cover an active area of solar cell 110 and thereby provide protection thereof during handling/shipping/operation. Optical coupling material 500 may comprise silicone gel or any other material(s) having suitable optical, thermal and physical properties.

If cured material 500 is soft, material 500 may be cured to any desired degree prior to placement of optical element 300.

Curing material 500 prior to placing optical element 300 may allow bubbles to escape during cure. Full or partial curing may allow a cured assembly to be shipped without an optical element in place, reducing shipping volume and reducing the likelihood of damage to the optical coupling due to shock during shipping.

According to some embodiments, the thermal expansion coefficient of support 200 is substantially matched to the stack of solar cell 110, optical coupling material 500, and the portion of optical element 300 residing below the location features 340a through 340d. Substantially matching the thermal expansion coefficient may reduce stress that the optical coupling would otherwise experience during thermal cycling. In some embodiments, for example, a composition of support 200 may be selected such that a coefficient of thermal expansion (CTE) of support 200 is substantially equal to $[(thickness_{cell} \times CTE_{cell}) + (thickness_{coupling\ material} \times CTE_{coupling\ material}) + (height_{element} \times CTE_{element})]/height_{support}$, wherein $height_{support}$ = a distance between the retention feature and the bottom of the support.

Fabrication of the FIG. 5 apparatus may include coupling solar cell 110 to substrate 100, placing support 200 over solar cell 110 so that opening 210 is disposed over an active area of solar cell 110, and depositing optical coupling material 500 on solar cell 110 using any techniques that are or become known. Optical element 300 is then placed within opening 210 to engage lip 220 with location features 340a through 340d. Placing optical element 300 within opening 210 may include biasing optical element 300 toward solar cell 110 to apply outward force against lip 220.

Figure 6A:
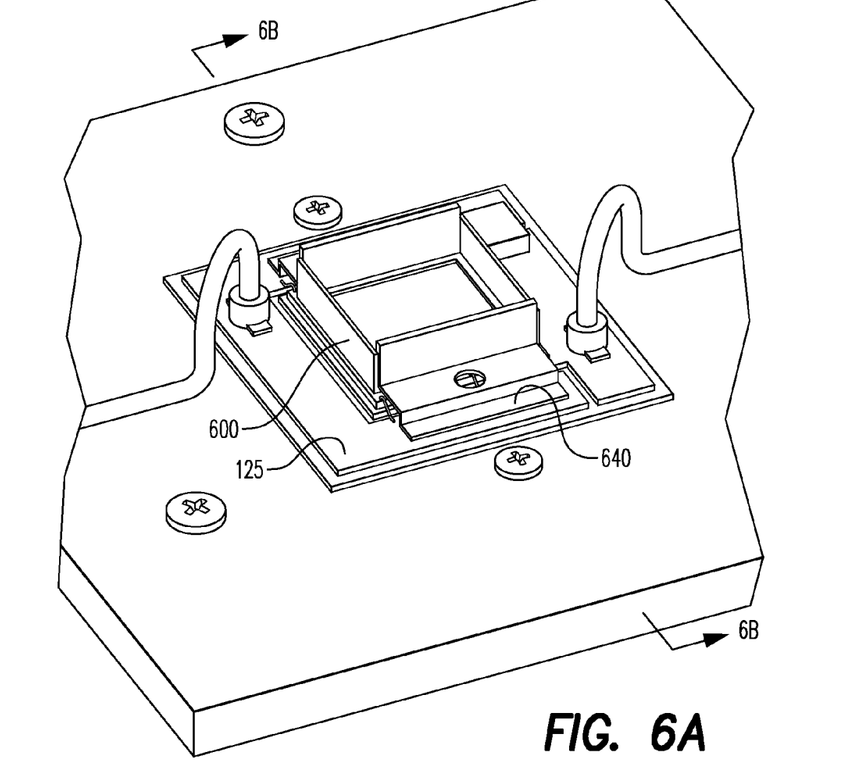
FIG. 6A is a perspective view of a substrate, a solar cell, a frame, and a heatsink according to some embodiments.
Figure 6B:
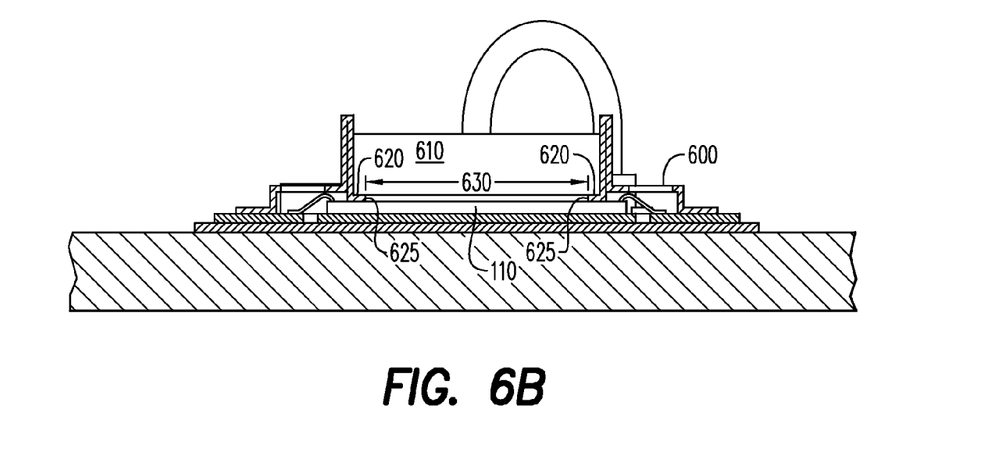
FIG. 6B is a cross-sectional side view of a substrate, a solar cell, a frame, and a heatsink according to some embodiments.

FIG. 6A is a perspective view and FIG. 6B is a cross-sectional side view of frame 600 coupled to the FIG. 1 apparatus according to some embodiments. The arrangement of FIG. 6A and FIG. 6B is described in detail in commonly-assigned co-pending U.S. patent application Ser. No. 12/118,026 (entitled Solar Cell Package For Solar Concentrator"), the contents of which are incorporated by reference herein for all purposes. Generally, frame 600 may be used in conjunction with support 200 to hold optical coupling material 500 as well as to assist positioning optical element 300. Any frame discussed in the above-mentioned co-pending application may be used in this regard.

Frame 600 and the top side of solar cell 110 define volume 610 above an active area of solar cell 110. In the illustrated embodiment, portion 620 of frame 600 extends substantially parallel to the top side of solar cell 110. Accordingly, portion 620 includes distal end 625 which may facilitate suitable deposition of optical coupling material 500 within volume 610. Specifically, material 500 may be deposited on solar cell 110 such that its sides are in contact with distal end 625 of frame portion 620. Such an arrangement may facilitate curing material 500 to a convex meniscus. Portion 620 of frame 600 may be coupled to a top side of solar cell 110 as shown or a gap may exist between portion 620 and solar cell 110 in some embodiments.

Frame 600 includes legs 640. Each of legs 640 is coupled to conductive element 125 and extends over one or more wire-bonds 120. Legs 640 may be epoxied to conductive element 125 in some embodiments. Frame 600 may be comolded into a lid (or overmold) of solar cell 110 in some embodiments, which may reduce a need for legs 640.

The illustrated height of frame 600 may also assist in maintaining a horizontal position of a lower part of optical element 300 by strictly limiting a range of horizontal movement of element 300. One or more sides of frame 600 above solar cell 110 may simply include portion 620, with no portion of frame 600 extending above portion 620.

Figure 7:
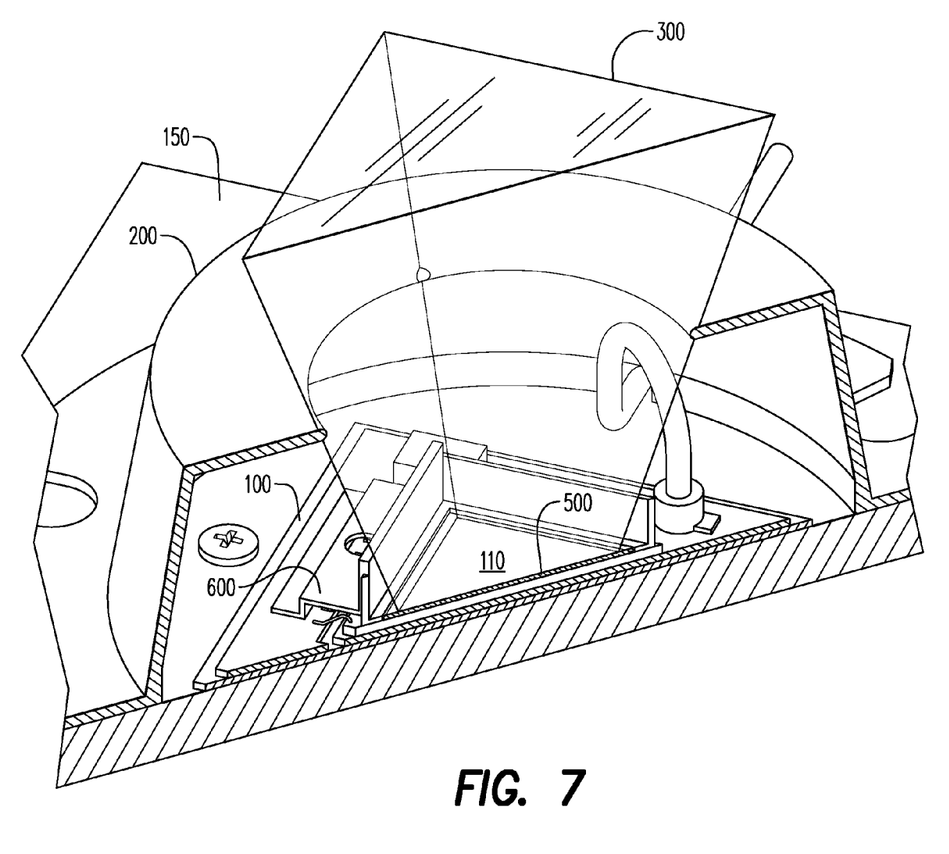
FIG. 7 is a partially transparent view of a substrate, a support, an optical element, a solar cell, a frame, optical coupling material and a heatsink according to some embodiments.

FIG. 7 is a perspective view similar to FIG. 5 showing support 200 and optical element 300 disposed over the FIG. 6 arrangement. More particularly, FIG. 7 shows substrate 100 coupled to heatsink 150, solar cell 110 coupled to substrate 100, and frame 600. Optical coupling material 500 is disposed within volume 610 is compressed by lower surface 320 of element 300. Again, optical element 300 is disposed within opening 210 and location features 340a through 340c are engaged with lip 220 of support 200.

Figure 8:
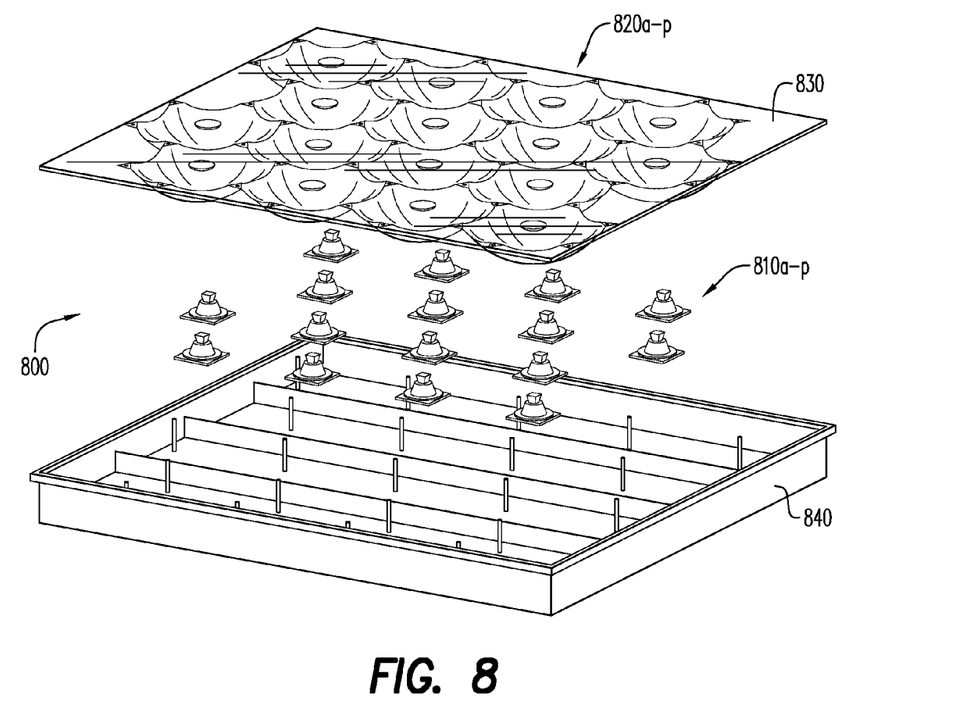
FIG. 8 is an exploded perspective view of an array of concentrating solar radiation collectors according to some embodiments.

FIG. 8 is an exploded perspective view of apparatus 800 according to some embodiments. Apparatus 800 may generate electrical power from incoming solar radiation. Apparatus 800 comprises sixteen instantiations 810a-p of the FIG. 5 or FIG. 7 apparatus. Wires 135 and 140 of each of apparatuses 810a-p may be connected in series to create an electrical circuit during reception of light by apparatus 800. For clarity, wires 135 and 140 are not illustrated. Embodiments are not limited to the arrangement shown in FIG. 8.

Each of apparatuses 810a-p is associated with one of concentrating optics 820a-p. As described in U.S. Patent Application Publication No. 2006/0266408, each of concentrating optics 820a-p includes a primary mirror to receive incoming solar radiation and a secondary mirror to receive radiation reflected by the primary mirror. Each secondary mirror then reflects the received radiation toward an exposed surface of optical rod 500 within a corresponding one of apparatuses 810a-p.

A perimeter of each primary mirror may be substantially hexagonal to allow adjacent sides to closely abut one another as shown. Each primary mirror may comprise low iron soda-lime or borosilicate glass with silver deposited thereon, and each secondary mirror may comprise silver and a passivation layer formed on a substrate of soda-lime glass. The reflective coatings of the primary and secondary mirrors may be selected to provide a desired spectral response to the wavelengths of solar radiation to be collected, concentrated and converted to electricity by apparatus 800.

Each primary mirror and secondary mirror of concentrating optics 820a-p is physically coupled to substantially planar window or cover glazing 830. Each of apparatuses 800a-p is to be coupled to backpan 840. Backpan 840 may comprise any suitable shape and/or materials and may provide strength, electrical routing, and heat dissipation to apparatus 800.

Figure 9:
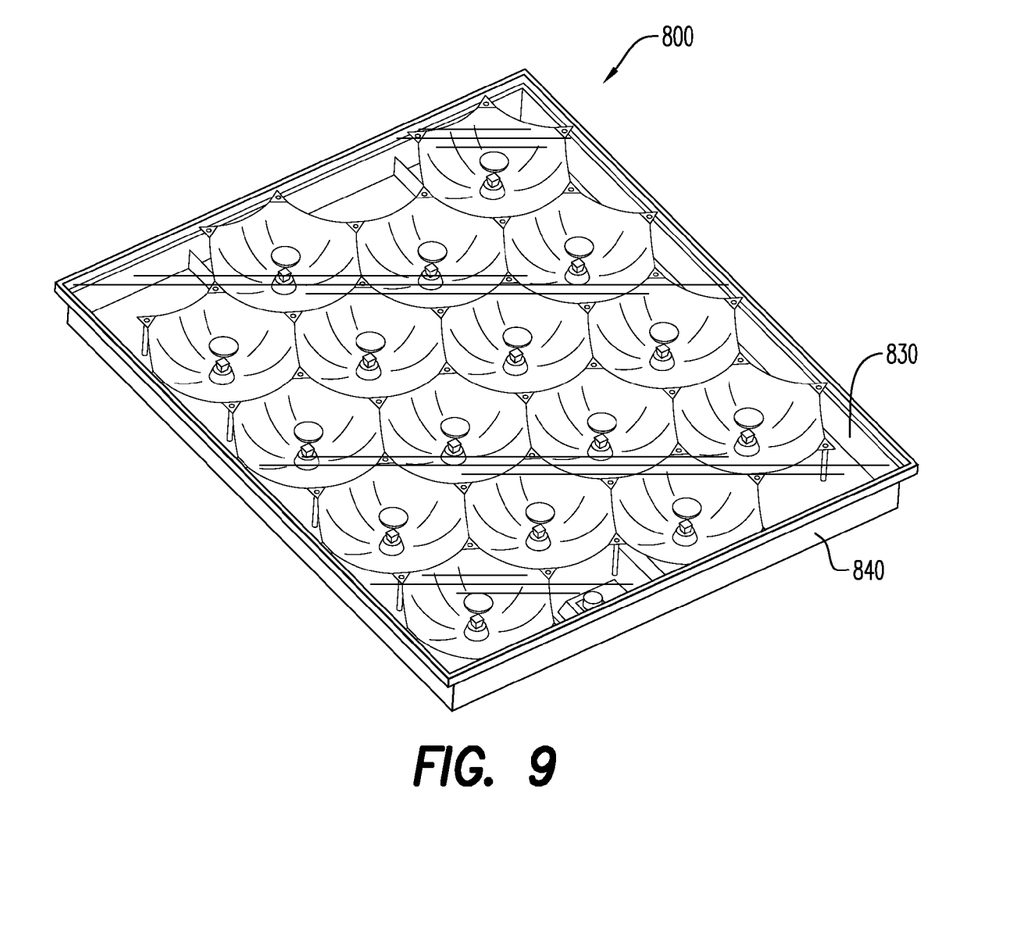
FIG. 9 is a perspective view of an array of concentrating solar radiation collectors according to some embodiments.

FIG. 9 is a perspective view of assembled apparatus 800 according to some embodiments. As shown, window or cover glazing 830 is secured to backpan 840. Each of apparatuses 810a-p passes through an opening in its corresponding primary mirror and is positioned beneath its corresponding secondary mirror.

The illustrated arrangement allows an exposed surface of each optical element of apparatuses 810a-p to receive concentrated light. As described above, the received light is passed to a corresponding solar cell which generates electrical current in response. The electrical current generated by each of apparatuses 810a-p may be received by external circuitry coupled to backpan 840 in any suitable manner. Assembled apparatus 800 may be mounted on a sun-tracking device to maintain a desired position relative to the sun during daylight hours.

Figure 10A:
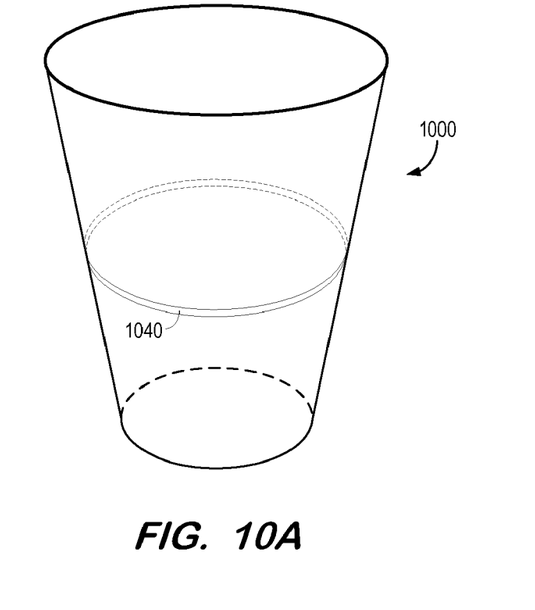
FIG. 10A is a perspective view of an optical element according to some embodiments.
Figure 10B:
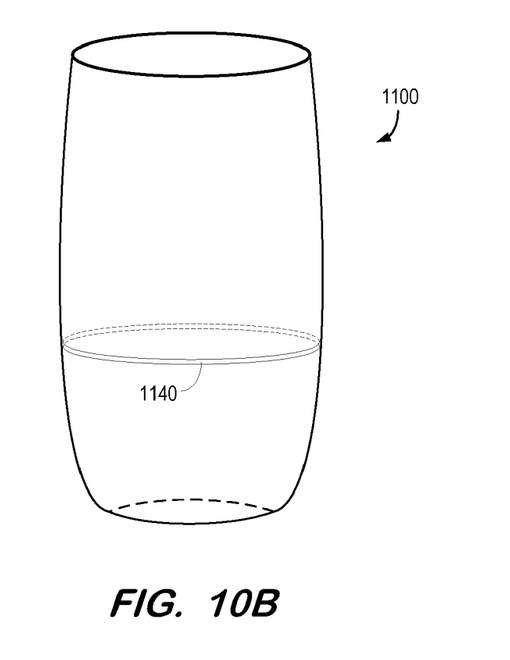
FIG. 10B is a perspective view of an optical element according to some embodiments.

FIGS. 10A and 10B comprise perspective views of optical elements 1000 and 1100 according to some embodiments. Location features 1040 and 1140 of optical elements 1000 and 1100 comprise continuous grooves. Accordingly, feature 1040 or feature 1140 may be disposed within support 200 such that lip 220 engages feature 1040 or feature 1140 over an entire circumference of element 1000 or element 1100. An optical element and its location features may comprise any shape, arrangement, or composition according to some embodiments.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. An apparatus comprising:
    a heatsink;
    a substrate coupled to the heatsink;
    a solar cell coupled to the substrate;
    an integral support coupled to the heatsink, the support defining an opening over the solar cell and comprising a retention feature; and
    an optical element disposed within the opening, the optical element comprising a solid substantially light-transparent material and a location feature in contact with the retention feature of the support,
    wherein the location feature comprises an indentation within the substantially light-transparent material of the optical element, the indentation defined by an edge of the optical element,
    wherein the optical element includes an upper surface to receive concentrated light and a lower surface through which light passes to the solar cell, and
    wherein the location feature is disposed between the upper surface and the lower surface.

2. An apparatus according to claim 1, wherein the retention feature comprises a lip defining the opening over the solar cell.

3. An apparatus according to claim 1,
    wherein the edge extends from the upper surface to the lower surface.

4. An apparatus according to claim 3, wherein the optical element comprises a second indentation defined by a second edge of the optical element,
    wherein the second edge extends from the upper surface to the lower surface, and
    wherein the support comprises a second retention feature to engage the second notch and to assist in retaining the position of the optical element with respect to the solar cell.

5. An apparatus according to claim 1, further comprising:
    a frame coupled to the top side of the solar cell,
    wherein the frame and the top side of the solar cell define a volume.

6. An apparatus according to claim 1, further comprising:
    optical coupling material disposed between the lower surface of the optical element and the top side of the solar cell,
    wherein a coefficient of thermal expansion (CTE) of the support is substantially equal to $[(\text{thickness}_{cell} \times \text{CTE}_{cell}) + (\text{thickness}_{coupling\ material} \times \text{CTE}_{coupling\ material}) + (\text{height}_{element} \times \text{CTE}_{element})]/\text{height}_{support}$, and
    wherein $\text{height}_{element}$=a distance between the location feature and the lower surface of the element and $\text{height}_{support}$=a distance between the retention feature and the bottom of the support.

* * * * *